(12) United States Patent
Arndt et al.

(10) Patent No.: US 6,565,666 B1
(45) Date of Patent: May 20, 2003

(54) CAPILLARY DRY PROCESS AND APPARATUS

(75) Inventors: Russell H. Arndt, Wappingers Falls, NY (US); Glenn Walton Gale, Austin, TX (US); Frederick William Kern, Jr., Colchester, VT (US); Kenneth T. Settlemyer, Jr., Poughquag, NY (US); William A. Syverson, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 172 days.

(21) Appl. No.: 09/723,069

(22) Filed: Nov. 27, 2000

(51) Int. Cl.$^7$ .................................................. B08B 7/00
(52) U.S. Cl. ................................. 134/6; 134/2; 134/42; 134/902; 428/98; 428/113; 428/131; 428/134; 428/147; 428/148; 428/220; 438/906
(58) Field of Search .......................... 134/6, 2, 42, 902; 428/98, 113, 131, 134, 147, 148, 220; 438/906

(56) References Cited

U.S. PATENT DOCUMENTS

| | | | | |
|---|---|---|---|---|
| 4,643,774 A | * | 2/1987 | Kishida et al. | 134/1 |
| 4,765,904 A | * | 8/1988 | Kaplan | 210/637 |
| 5,658,636 A | | 8/1997 | Reed et al. | |

FOREIGN PATENT DOCUMENTS

JP          4-334578      * 11/1992

* cited by examiner

*Primary Examiner*—Randy Gulakowski
*Assistant Examiner*—M. Kornakov
(74) *Attorney, Agent, or Firm*—Steven Capella

(57) ABSTRACT

Disclosed is a method of removing liquid from a surface of a semiconductor wafer that comprises the steps of providing a plurality of capillary channels, each said capillary channel having a first opening and a second opening, and then placing said first openings in contact with the liquid in a manner effective in drawing away the liquid by capillary action.

11 Claims, 2 Drawing Sheets

CAPILLARY DRY PROCESS AND APPARATUS

FIELD OF THE INVENTION

This invention relates to drying microsurfaces, such as semiconductor wafers, during manufacture.

BACKGROUND OF THE INVENTION

During the manufacture of semiconductor wafers, it is common that liquid chemical processing take place at various steps in the manufacturing process. Commonly, these "wet chemical" steps will involve relatively harsh chemicals such as hydrofluoric, sulfuric, phosphoric, and nitric acids and ammonium hydroxide, and the like. These harsh wet chemicals are used for a variety of steps such as film removal, cleaning, and surface conditioning.

Harsh wet chemicals used in a particular processing step must be removed from the wafer prior to subsequent processing. Currently, the industry commonly uses a simple water rinse with deionized (e.g., distilled) water. Unfortunately, deionized water actually dissolves minute quantities of silicon from the surface of the wafer. When evaporated off the wafer, the deionized water will typically leave small deposits of dissolved silicon in various surface structures on the wafer. These deposits, known as "watermarks" are usually harmless, but will occasionally deposit in a critical location and render the wafer inoperative. Hence, a certain percentage of defects during manufacture are attributable to such watermarks and could be eliminated if a way were found to remove deionized water without evaporation.

BRIEF SUMMARY OF THE INVENTION

Disclosed herein is a method of drying water from surface without evaporation by utilizing capillary action. The invention is particularly useful for microsurfaces, meaning surfaces that have microscopic detail and features, particularly the surfaces of semiconductor wafers. A plurality of capillary channels are bundled to form a drying plate that is then brought in contact with the wet wafer surface, thereby drawing off the water. In a preferred embodiment, a flow of gas is provided across the upper openings of the capillary channels in order to enhance the capillary action. The invention may be generalized to liquids other than water.

DETAILED DESCRIPTION OF THE INVENTION

Figure 1:
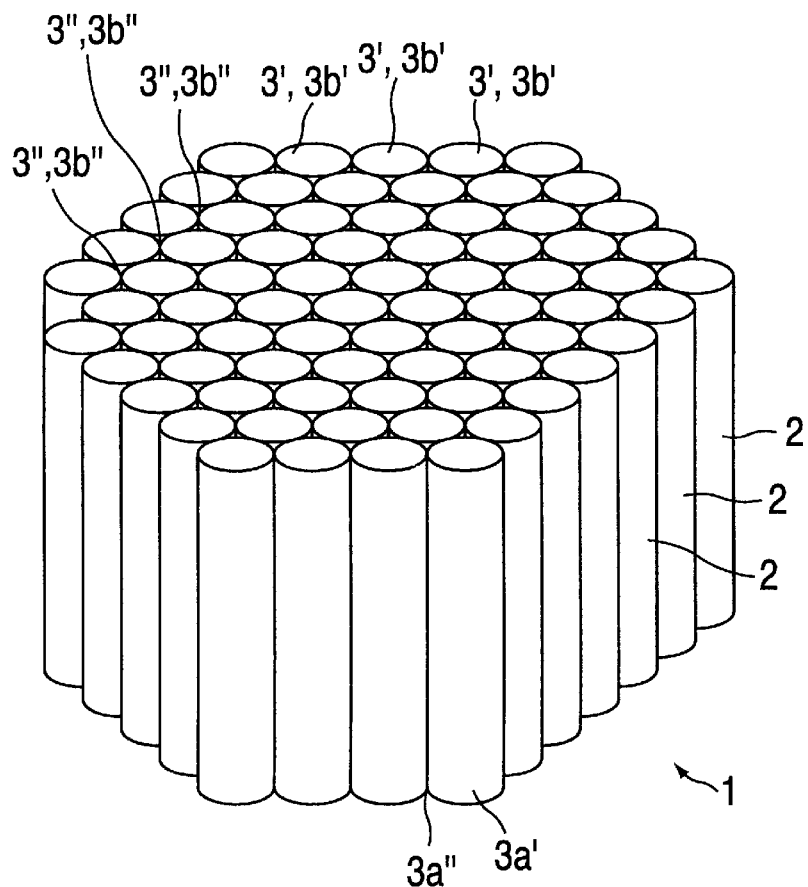
FIG. 1 shows a drying plate with long capillary tubes.

Referring to FIG. 1, there is generally shown a drying plate 1 comprising a plurality of capillary tubes or rods 2 bundled together. Each capillary tube—if a tube—defines an axial capillary channel 3'. The tubes as shown are cylindrical and therefore do not pack together perfectly, the result being that a second set of capillary channels 3" may optionally be defined by the small spaces between the tubes 2. Whether these spaces 3" qualify as capillary channels, of course, depends on whether they are small enough to provide capillary action under the conditions in which the drying plate 1 will be used and the surface tension of the liquid to be removed. Unless otherwise indicated, the use of the term "capillary channel" and the label 3 in this specification will refer to channels both within the tubes and those formed between the tubes. It must be noted that cylindrical tubes are shown for purposes of illustration only, the tubes actually used may be of any cross-sectional shape suited to the purpose.

The capillary tubes 2 will generally be bonded together by either an adhesive or by heat. Quartz, glass or plastic tubes, when exposed to sufficient heat for a sufficiently long period of time, will soften slightly and fuse together. Hydrophilic materials, such as quartz, nylon, charge-modified polymers, and the like, or even metals that form passivating oxide, are preferred.

In some cases, it may be desirable to use capillary channels 3 so small that no capillary tube of the desired size is available for the purpose, or it may be that those that are available are too delicate to withstand fusing. In such cases, one may substitute rods for tubes and thereby create a drying plate with only the spaces 3" between the rods as the capillary channels 3. Yet another alternative is to perforate a sheet of material, such as a polymer, with channels small enough to provide capillary action. This may be achieved with, for example, laser ablation.

The capillary channels 3 each have a first opening 3a and a second opening 3b at opposing ends. The set of first openings forms a substantially planar contact surface that is placed in contact with the surface of a wet semiconductor wafer and thereby draws liquid off the wafer without evaporation. In the drawing, the labels 3' and 3b' or 3" and 3b" are used interchangeably because to indicate an opening to a channel is to indicate the channel itself. Unless otherwise indicated, any reference to a capillary channel in this specification refers to both In general, the cross-sectional area of the capillary channels 3 of the invention will be one square micron or less. Preferably, the capillary channels 3 of the invention will have a diameter of about 0.1 micron. For channels that are not circular in cross-section, this would correspond to a cross-sectional area of $0.05 \times 0.05 \times \pi = 0.0079$ square microns.

In a preferred method of the invention, a flow of gas is provided across the set of second openings 3b so as to enhance the capillary effect. Inert or relatively inert gases such as nitrogen are preferred.

Figure 2:
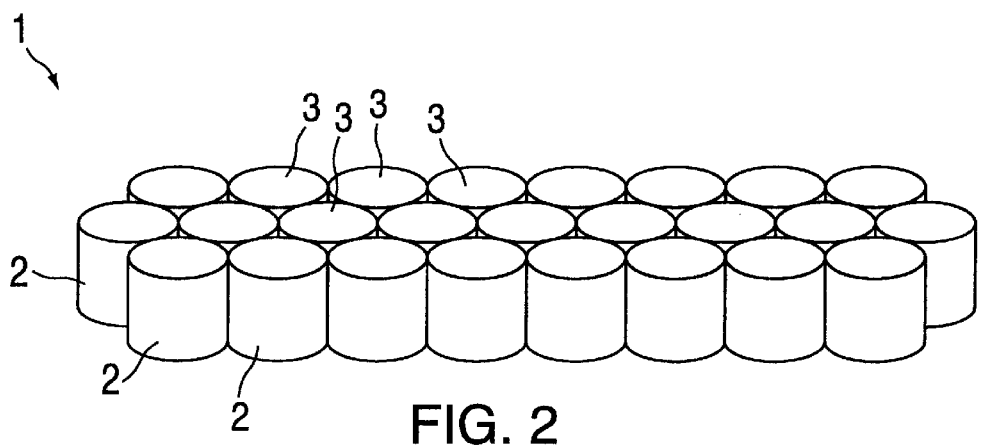
FIG. 2 shows a drying plate with short capillary tubes.

Referring to FIG. 2, there is shown an alternative embodiment of the invention utilizing short capillary tubes 2. The shorter drying plate does not have the capacity of the tall plate (FIG. 1), but has the added advantage of enhanced flexibility.

Figure 3:
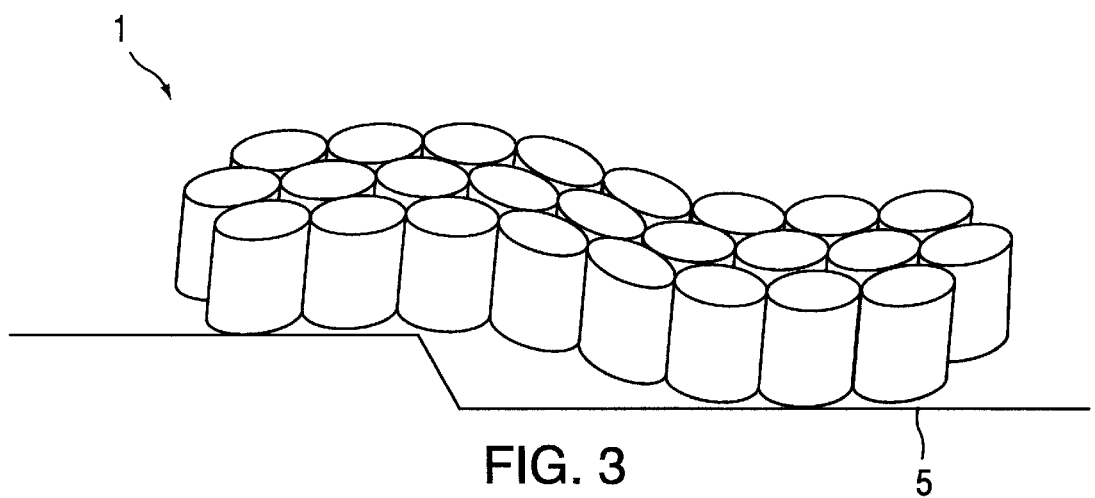
FIG. 3 shows a drying plate with sufficiently short capillary tubes to be capable of flexing.

FIG. 3 shows how the drying plate of FIG. 2 is able to flex to substantially conform to the surface 5 of the microsurface. In general, flexible plates will have a thickness no greater than about 100 to about 1000 times the diameter of the largest capillary tubes or rods 2 from which it is made. Additionally, it is preferred that the thickness of the flexible plate be no greater than about 100 to about 1000 times the diameter of any trenches on the microsurface.

The decreased capacity of the short plates may be offset by providing a flow of gas across the second openings so as to improve the capillary action as stated previously, and still more so by evaporating liquid from the tubes and into the gas stream. The disadvantage of this technique, however, is that silica deposits will tend to form in the capillary channels from the evaporation and thereby shorten the useful life of the drying plate.

Figure 4:
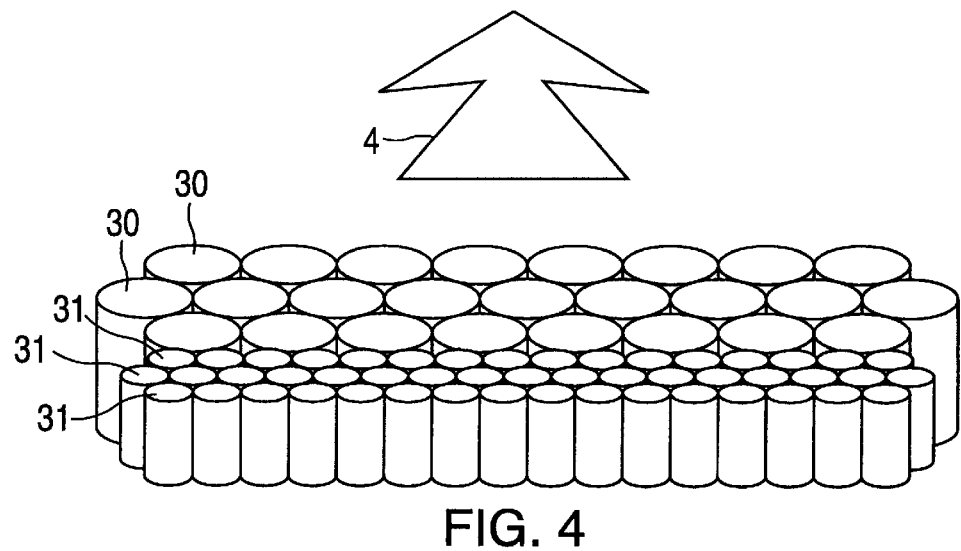
FIG. 4 shows a drying plate with capillary tubes of varying diameter.

Referring to FIG. 4, there is shown another embodiment of the invention wherein the drying plate comprises capillary channels of varying size. In this drawing we show two different sizes, large 30 and small 31, though more than two sizes is an option. In this embodiment of the invention, the drying plate is dragged across the wet surface of the semiconductor wafer such that the largest capillary channels form a leading edge and the smaller capillary channels form a trailing edge. In the perspective of FIG. 4 this would be in the direction of the arrow 4. The larger capillary channels 30 act as the vanguard and remove the bulk of the liquid so that the trailing smaller channels 31 are not saturated. The smaller channels 31 then remove the smaller droplets of liquid that are found in smaller semiconductor structures, such as trenches.

The preferred cross-sectional area for the leading edge of such a dual-size drying plate would be about ten to about one hundred times the cross-sectional area of the trailing capillary channels, with the option of providing other channels having widths within that range. In general, the trailing capillary channels will preferably be less than or equal to the size of any trenches on the microsurface.

After soaking up the liquid, the drying plate 1 itself must be dried out for reuse. This can be done with heat drying, gas flow, vacuum, or any other technique or combinations thereof that are effective in drying out the plate. To avoid silica deposits in the plate, it is preferred that any evaporative drying technique be preceded by a rinse.

While preferred embodiments have been shown and described, various modifications and substitutions may be made thereto without departing from the spirit and scope of the invention. Accordingly, it is to be understood that the present invention has been described by way of illustration only, and such illustrations and embodiments as have been disclosed herein are not to be construed as limiting to the claims.

What is claimed is:

1. A method of removing liquid from a surface, the method comprising:

providing a plurality of leading capillary channels, said plurality of leading capillary channels each having a first opening and a second opening;

providing a plurality of trailing capillary channels, said plurality of trailing capillary channels also each having a first opening and a second opening, wherein said trailing capillary channels are of a smaller cross-sectional area than said leading capillary channels; and moving said first openings of said leading capillary channels across the surface, followed by moving said first openings of said trailing capillary channels across the surface, thereby drawing away the liquid by capillary action.

2. The method of claim 1 wherein said surface is a microsurface.

3. The method of claim 2 wherein said microsurface is a surface of a semiconductor.

4. The method of claim 1 further comprising the additional step of:

providing a flow of gas across said second openings in order to enhance said capillary action.

5. The method of claim 1 wherein said first openings each have a cross-sectional area no greater than about a square micron.

6. The method of claim 5 wherein said first openings each have a cross-sectional area of about 0.0079 square microns.

7. The method of claim 1 wherein said leading capillary channels have a cross-sectional area of about 10 to about 100 times larger than the cross-sectional area of said trailing capillary channels.

8. The method of claim 1 wherein said capillary channels are bound together to form a drying plate.

9. The method of claim 8 wherein said drying plate is sufficiently thin so as to be flexible.

10. A drying plate for removing liquid from a surface, comprising:

a plurality of leading capillary channels, bound together to form a leading edge, and a plurality of trailing capillary channels, bound together to form a trailing edge;

wherein said leading edge is bound to said trailing edge, each of said leading and trailing capillary channels having a first opening and a second opening, wherein the cross-sectional area of said leading capillary channels is larger than the cross-sectional area of said trailing capillary channels; and said leading and trailing capillary channels bound in parallel such that said first openings define a substantially planar contact surface.

11. The apparatus of claim 10 wherein the cross-sectional area of said leading capillary channels are from about 10 to about 100 times larger than the cross-sectional area of said trailing capillary channels.

* * * * *